United States Patent [19]

Fukaya et al.

[11] Patent Number: 4,839,582
[45] Date of Patent: Jun. 13, 1989

[54] SIGNAL ANALYZER APPARATUS WITH AUTOMATIC FREQUENCY MEASURING FUNCTION

[75] Inventors: Seiryo Fukaya, Ebina; Mitsuyoshi Takano, Tokyo; Narushi Amamoto, Fujisawa, all of Japan

[73] Assignee: Anritsu Corporation, Tokyo, Japan

[21] Appl. No.: 212,935

[22] Filed: Jun. 29, 1988

[30] Foreign Application Priority Data

Jul. 1, 1987 [JP] Japan .................. 62-165040

[51] Int. Cl.$^4$ ............................................. G01R 23/16
[52] U.S. Cl. ................................. 324/77 B; 364/485
[58] Field of Search ............... 324/77 B, 77 C, 77 CS, 324/79 R, 79 D; 364/484, 485

[56] References Cited

U.S. PATENT DOCUMENTS

| | | | |
|---|---|---|---|
| 4,306,186 | 12/1981 | Nakazawa et al. | 324/77 B |
| 4,578,638 | 3/1986 | Takano et al. | 364/485 |
| 4,611,164 | 9/1986 | Mitsuyoshi et al. | 324/77 B |
| 4,649,496 | 3/1987 | Anderson et al. | 364/485 |

*Primary Examiner*—Stewart J. Levy
*Assistant Examiner*—Louis M. Arana
*Attorney, Agent, or Firm*—Frishauf, Holtz, Goodman & Woodward

[57] ABSTRACT

In a siganl analyzer apparatus, a signal received while a local oscillator is swept in a analog manner is selected and detected by an IF circuit using a desired RBW, and the resultant data is stored in a memory and displayed on a display unit. A sweep signal generator controls the local oscillator in an analog manner such that frequency measurement can be performed within a desired measuring frequency range. A peak search section outputs a frequency valve corresponding to the maximum value of the data in the memory. A discriminator compares the span set in the sweep signal generator with the resolution bandwidth set in the IF circuit, when a frequency is measured using the desired span, and outputs the obtained value. A frequency controller causes the sweep signal generator to perform sweeping/measurement by setting a frequency detected by the peak search as a center frequency, and by using a span narrower than that used in the previous measurement cycle, on the basis of the comparison result from the discriminator. A frequency measuring section measures the frequency of an input signal using the output frequencies from the local oscillator and the IF circuit, on the basis of the comparison result from the discriminator, when the frequency controller causes the sweep signal generator to perform frequency measurement by minimizing the span.

17 Claims, 19 Drawing Sheets

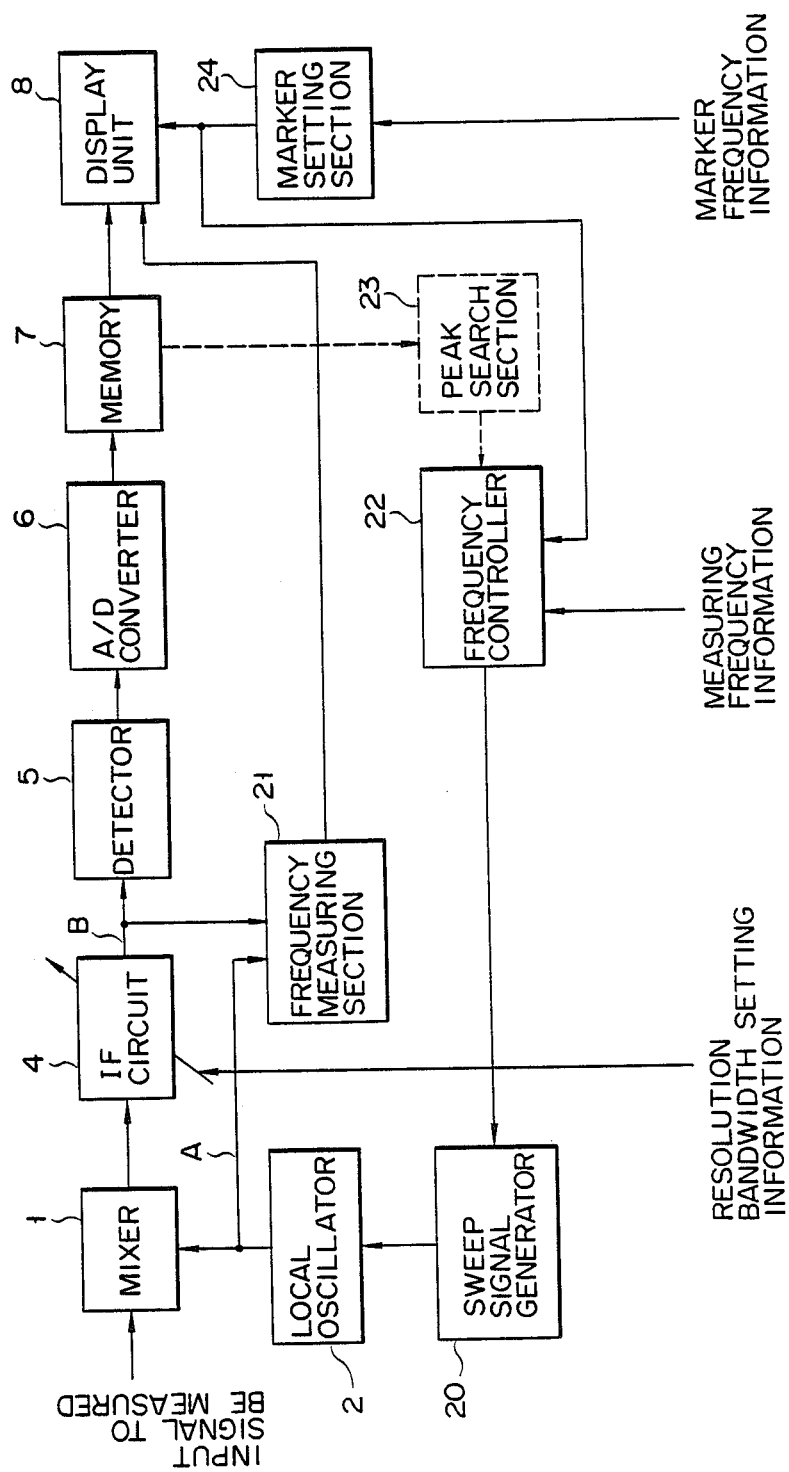
F I G. 1

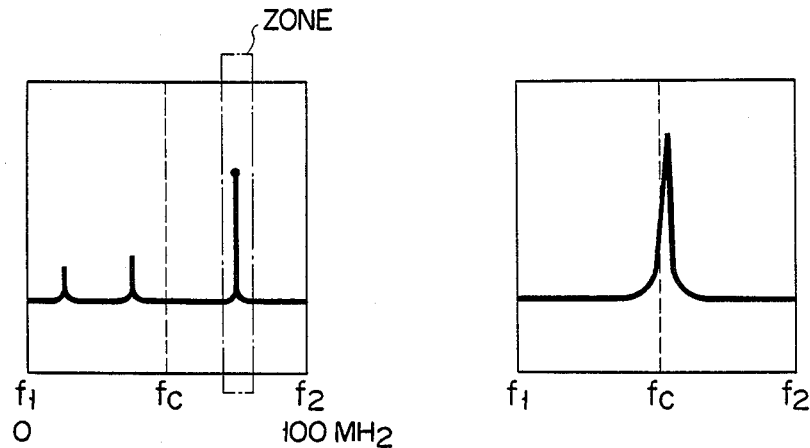
$f_2 - f_1 = 100$ MHZ
RBW = 50 KHZ
$f_m = 70$ MHZ
SWT = 20 S
F I G. 2A
$f_c = 70$ MHZ
$f_2 - f_1 = 10$ MHZ
RBW = 50 KHZ
SWT = 2 S
$f_p = 70.85$ MHZ
F I G. 2B
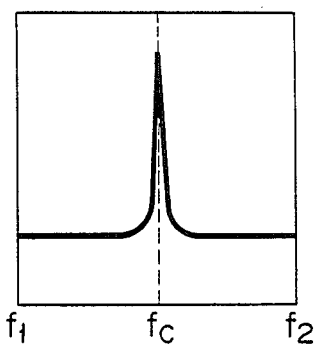
$f_c = f_p = 70.85$ MHZ
$f_2 - f_1 = 10$ MHZ
RBW = 50 KHZ
SWT = 2 S
F I G. 2C

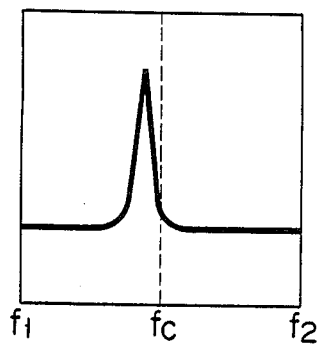
$f_c$ = 70.85 MHz
$f_2 - f_1$ = 1 MHz
RBW = 50 KHz
SWT = 200 ms
$f_p$ = 70.75 MHz
F I G. 2D
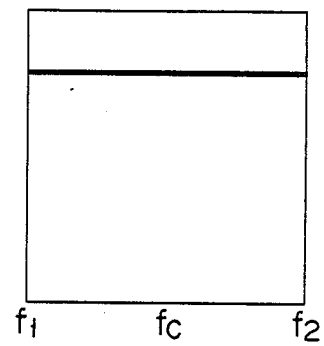
$f_1 = f_c = f_2$
$f_2 - f_1 = 0$
RBW = 50 KHz
SWT = 200 ms
F I G. 2F
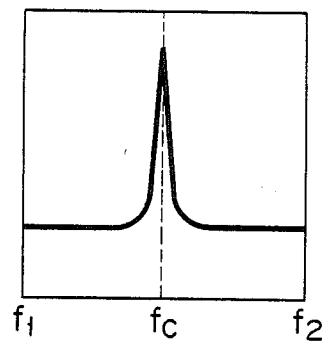
$f_c = f_p$ = 70.75 MHz
$f_2 - f_1$ = 1 MHz
RBW = 50 KHz
SWT = 200 ms
F I G. 2E

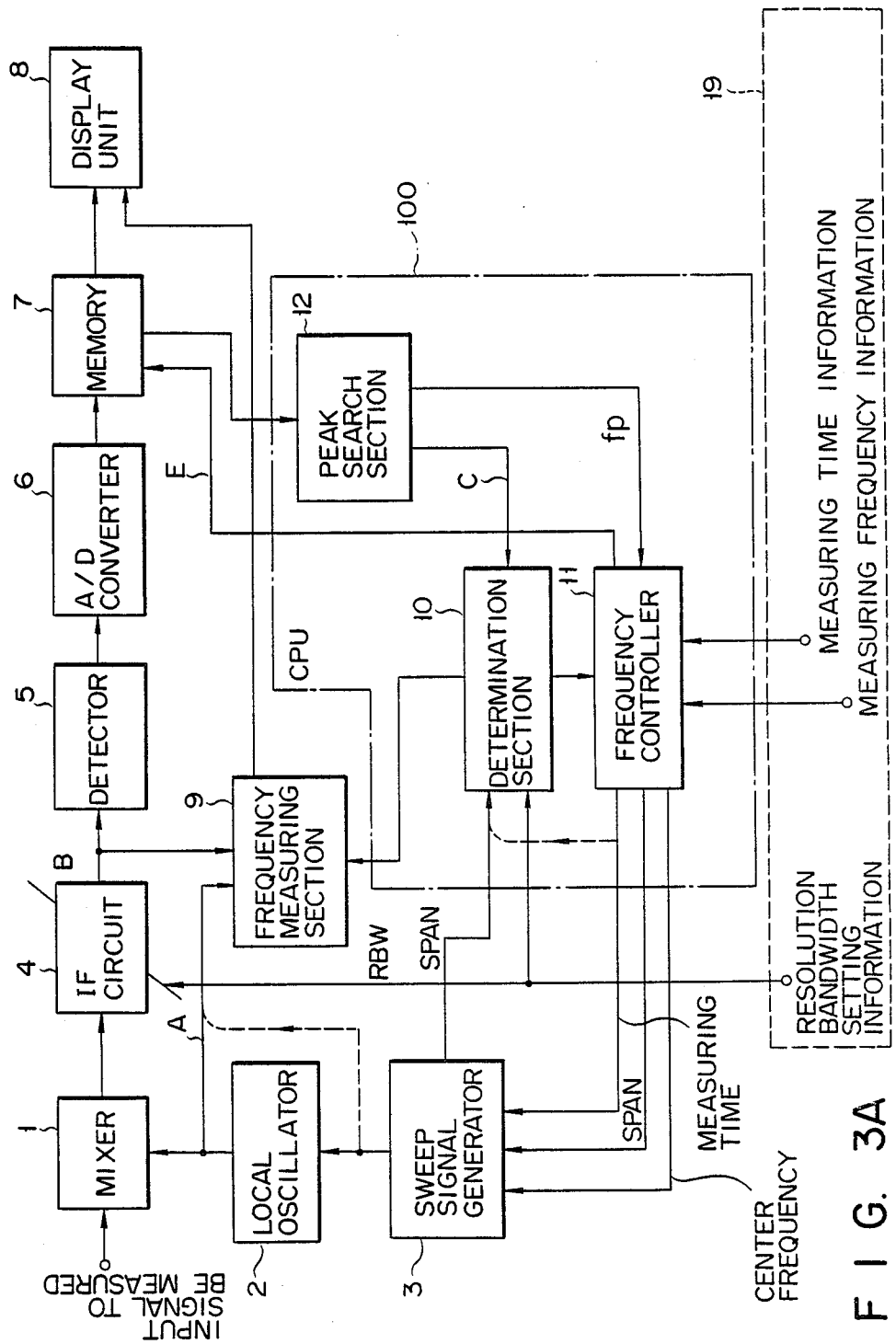
F I G. 3A

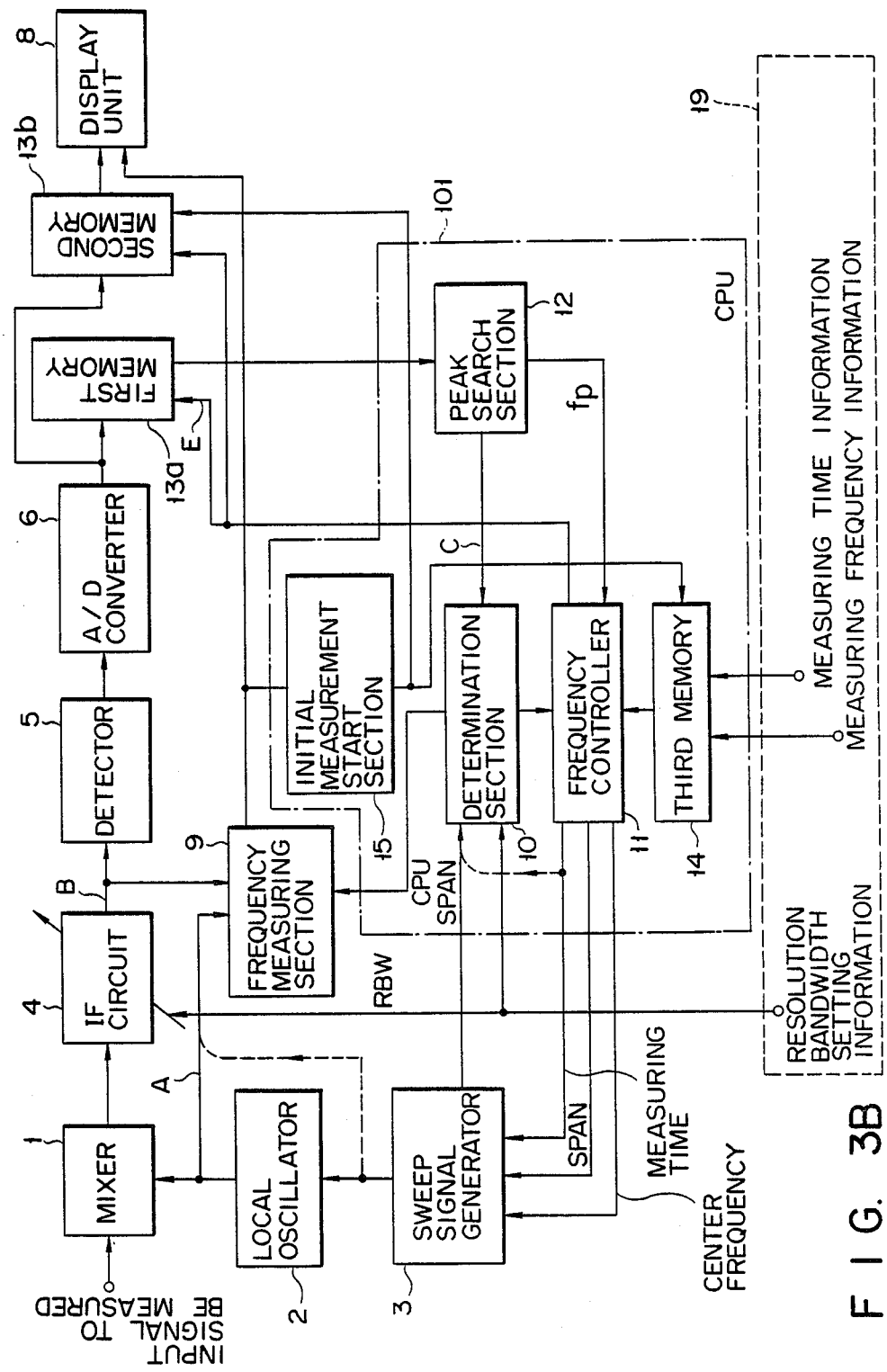
F I G. 3B

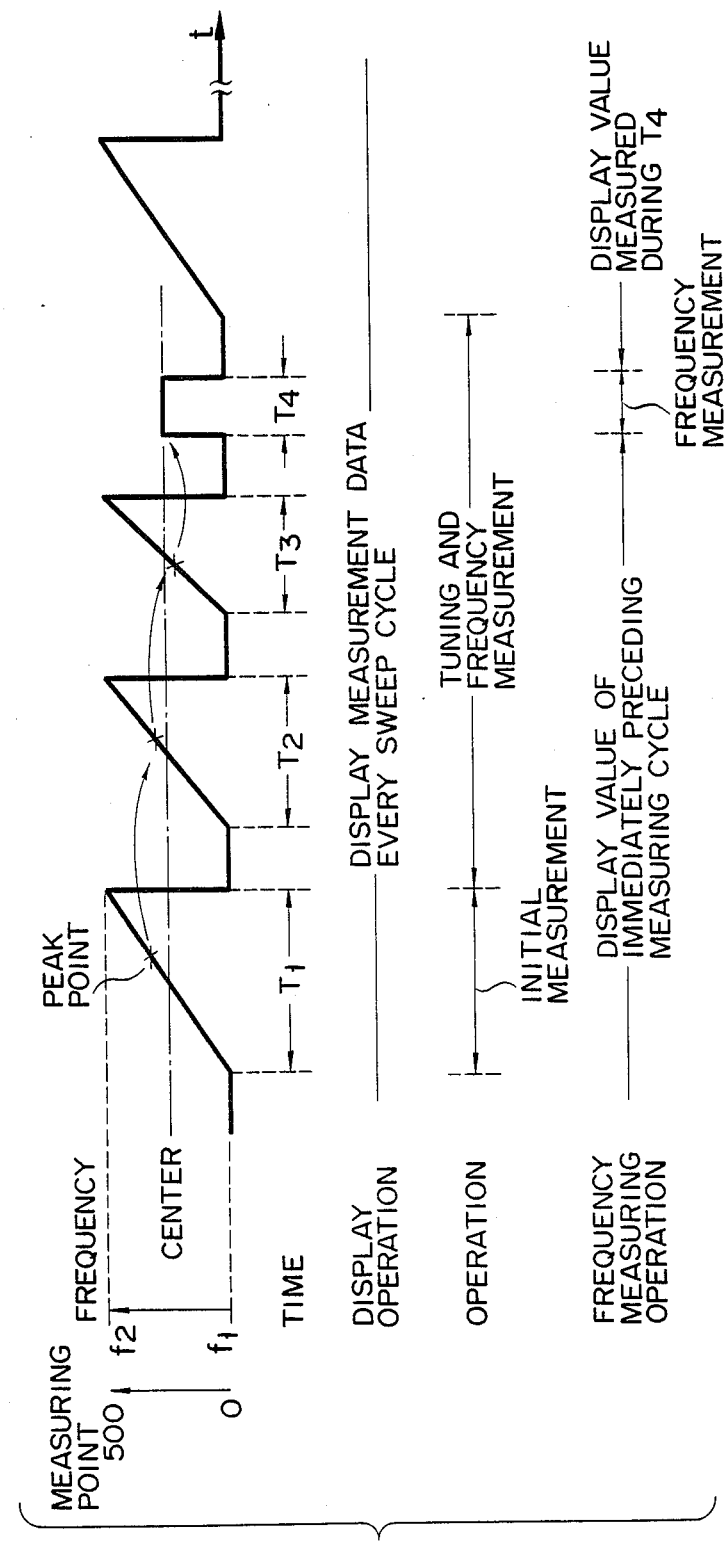
F I G. 5A

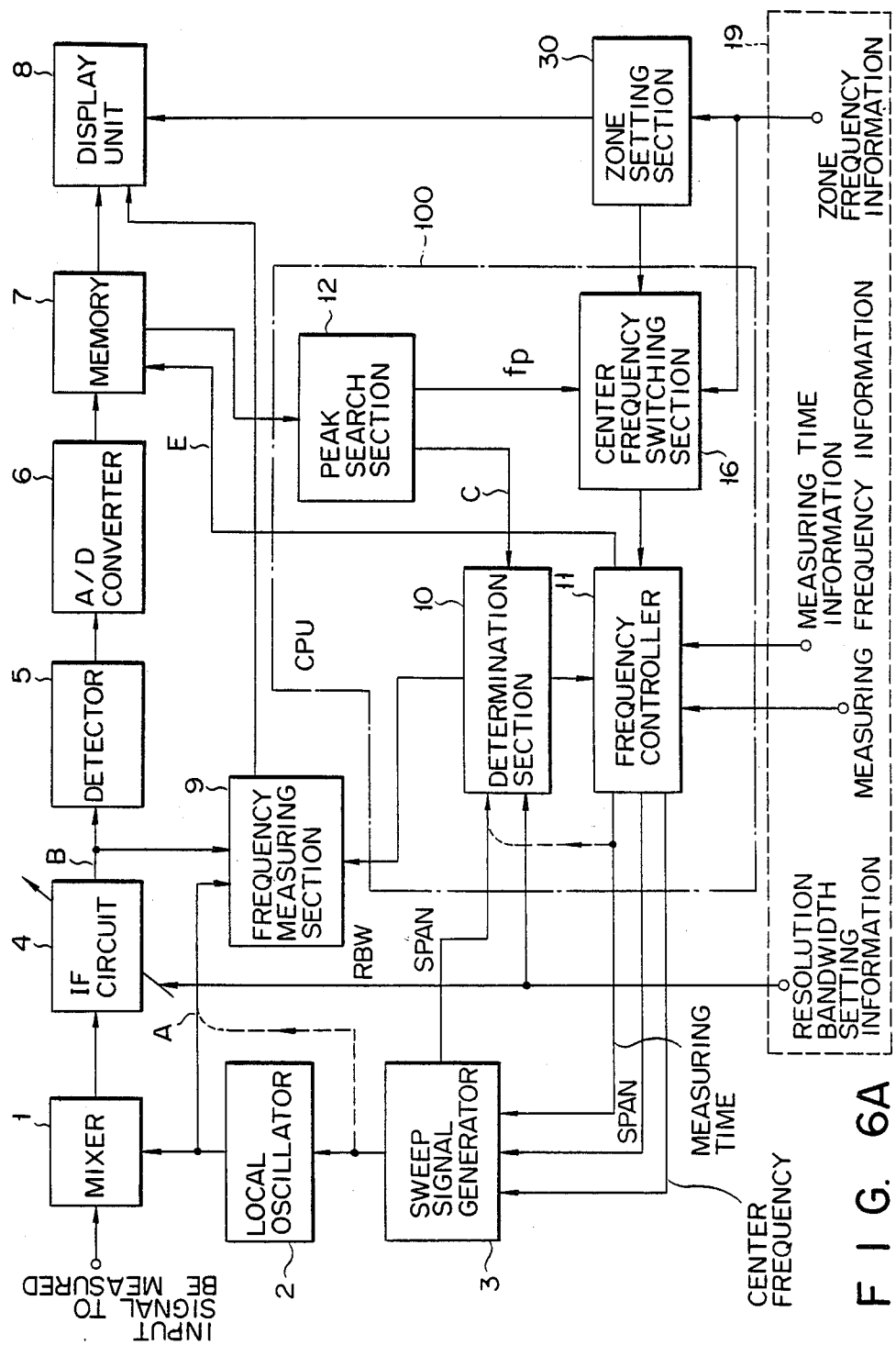
F I G. 6A

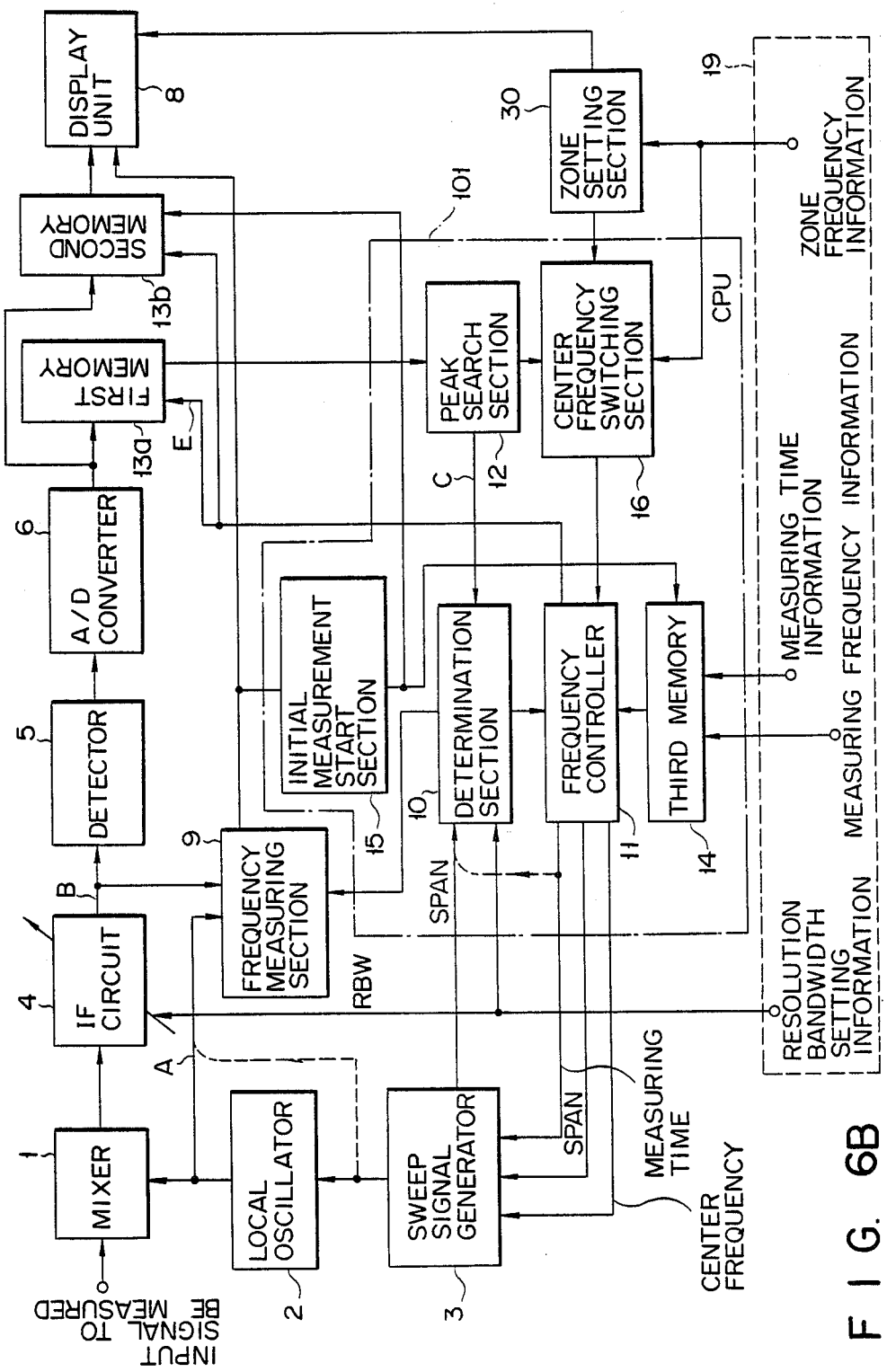
F I G. 6B

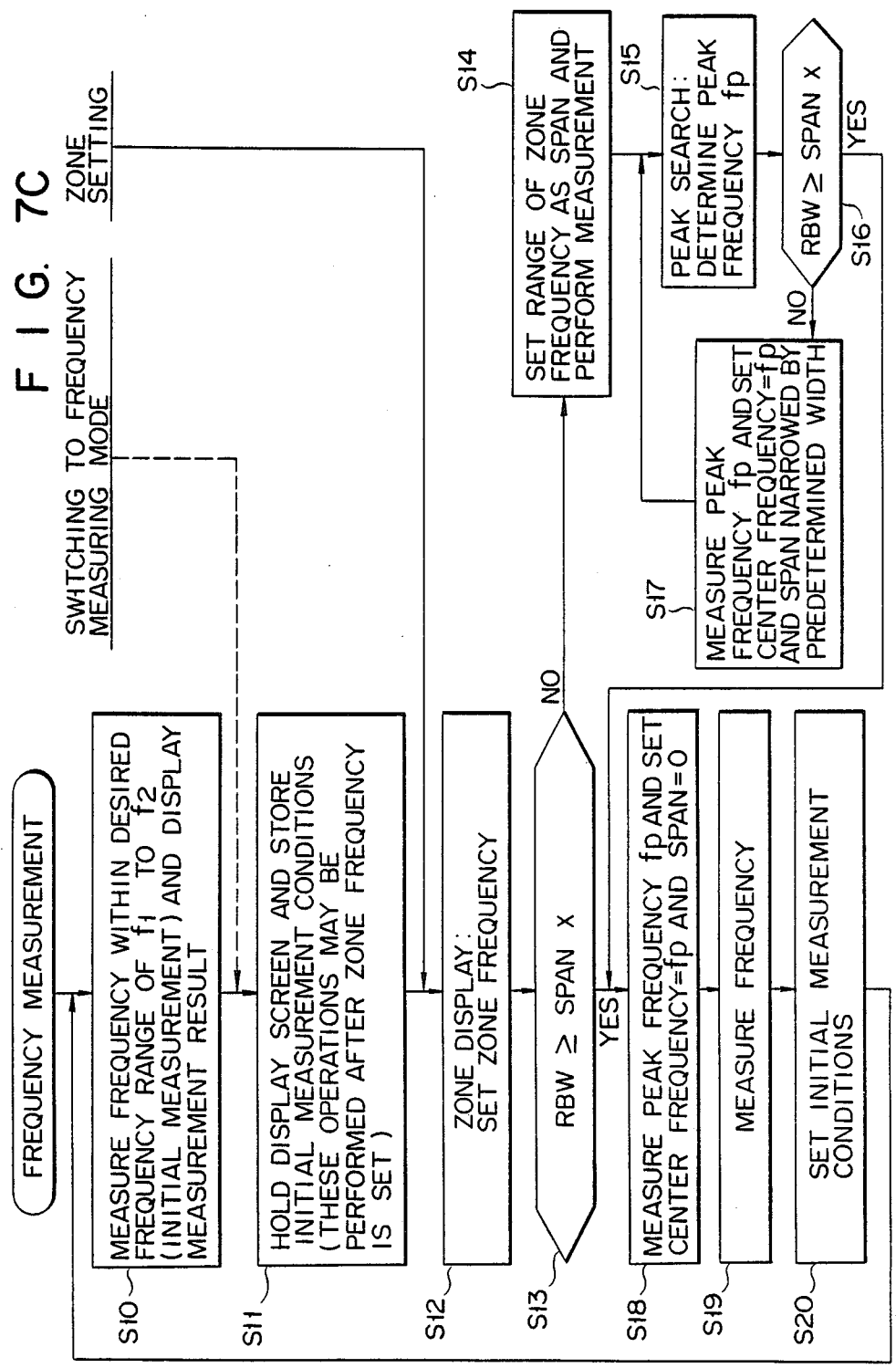

SIGNAL ANALYZER APPARATUS WITH AUTOMATIC FREQUENCY MEASURING FUNCTION

BACKGROUND OF THE INVENTION

1. Field of the Invention

This invention relates to a signal analyzer apparatus with an automatic frequency measuring function and, more particularly, to a signal analyzer apparatus for analyzing signal characteristics in a frequency region, upon sweeping of the signal in a wide frequency band, so that a frequency at a desired point of the characteristics can be measured with high precision.

In addition, this invention relates to a signal analyzer apparatus for facilitating frequency measurement of a signal by utilizing the technique disclosed in U.S. Pat. No. 4,611,164, entitled "Spectrum Analyzer With Automatic Peak Frequency Tuning Function", which is assigned to the present applicant.

2. Description of the Related Art

FIG. 1 illustrates the arrangement of a conventional spectrum analyzer (composed of those elements surrounded by solid lines) used for frequency measurement. FIGS. 2A to 2F show display examples of obtained by a conventional technique. The operation of this frequency measurement will now be described below.

Referring to FIG. 1, frequency controller 22 receives desired measuring frequency information (e.g., 0 to 100 MHz) and then commands sweep signal generator 20 to output to local oscillator 2 a sweep voltage corresponding to the desired measuring frequency information. Local oscillator 2 then outputs a signal, having a frequency proportional to the sweep voltage, to mixer 1. Mixer 1 mixes the output signal from local oscillator 2 with an input signal (0 to 100 MHz) to be measured, and converts the resultant signal into an intermediate-frequency (IF) signal. The IF signal is then selected by a predetermined resolution bandwidth in IF circuit 4, and is detected by detector 5. The detected signal is converted into a digital signal by A/D converter 6, after which the digital signal is stored in memory 7, in accordance with the frequency of the input signal to be measured, and is displayed by display unit 8. FIG. 2A shows such a display example. A marker (a black dot on the display) is set by marker setting section 24 at a desired spectrum point of the data displayed in this manner. Frequency information fm (70 MHz in FIG. 2A) at this time is supplied to frequency controller 22. Frequency controller 22 causes sweep signal generator 20 to perform sweep measurement by setting the center frequency and the frequency measuring width (f2−f1) in the example shown in FIG. 2A to be frequency fm and zero, respectively, in the example in FIG. 2F. In this state, frequency measuring section 21 additively measures output frequencies A and B from local oscillator 2 and IF circuit 4, and supplies its output signal to display unit 8, to numerically display the output signal as frequency information (A+B) of the input signal to be measured. Note that this value, i.e., (A+B) is obtained when an IF signal is obtained by a beat-down operation of mixer 1. When on the other hand, mixer 1 performs a beat-up operation, this value becomes (A−B).

In such frequency measurement, the relationship between the frequency resolution of a spectrum (to be determined by the band of IF circuit 4 and referred to as an RBW hereinafter) and the resolution of data processing must be considered. For example, in the example shown in FIG. 2A, the frequency measuring width (to be referred to as a span hereinafter) is 100 MHz (=f2−f1). Assuming that data is processed and displayed by dividing this span into 500 points on the axis of abscissa (frequency axis), then, the resolution of data processing is (2 MHz/1 point). In this case, if RBW=50 kHz, signals plotted between measuring points cannot be measured. In order to prevent this, local oscillator 2 is swept in an analog manner, so that the peak value of a signal between points is obtained upon detection, and is displayed at a predetermined point. Therefore, in the case of FIG. 2A, all input signals within the range of 0 to 100 MHz can be measured. However, a maximum frequency error becomes 2 MHz.

For this reason, in order to accurately measure a frequency, frequency tuning must be performed. For this purpose, the following condition must be satisfied:

$$RBW \geq span \times \alpha$$

for $\alpha = 0.02$ to $0.05$. FIGS. 2A to 2F show the display examples when frequency tuning is performed. As shown in FIG. 2B, the signal to be measured is magnified and measured by setting frequency fm (70 MHz), which is determined when the marker point is set at the desired spectrum in FIG. 2A, as center frequency fc, and reducing the span in FIG. 2A to 10 MHz (f2−f1). At this time, the marker is again set at the peak of the spectrum and frequency fp (=fm=70.85 MHz) corresponding to the peak is measured. Then, as shown in FIG. 2C, the spectrum is displayed by setting frequency fp as the center frequency. In addition, the span is reduced to 1 MHz, as shown in FIG. 2D, and frequency fp (70.75 MHz) at the peak point of the spectrum is measured. Then, as shown in FIG. 2E, the spectrum is displayed by setting frequency fp as the center frequency. In this case, in order to satisfy the above-described measuring condition, i.e., RBW=50 kHz $\geq$ span $\times \alpha$ = 1 MHz $\times$ 0.05, the span is set to be zero, as shown in FIG. 2F. In this state, the frequency is measured by frequency measuring section 21. The span is gradually reduced in this manner, since a target spectrum may fall outside a display screen if the span is reduced at once.

The above-described operation has been performed manually. In the operation, a technique of searching for the peak value of the spectrum, sequentially reducing the span, and performing measurement in a desired span is disclosed in the above-described U.S. Pat. No. 4,611,164. This technique is realized by adding peak search section 23 encircled by the dotted line in FIG. 1.

In such a conventional technique, the following problems arise:

(i) The above-described manual operation is very cumbersome, and a considerably long period of time is required for frequency measurement. Since an operation is performed while measuring conditions such as a span and RBW are considered and a screen is monitored, an operation error tends to be caused.

Although the technique described in U.S. Pat. No. 4,611,164 can partially assist the manual operation above described, it has nothing to do with frequency measurement with an RBW considered.

(ii) According to any conventional technique, a display screen must be changed for a simple operation of accurately measuring a frequency. Therefore, when measurement of the next cycle is to be performed with an initial screen state again, the initial screen must be recorded and initial values must be set again manually.

SUMMARY OF THE INVENTION

It is, therefore, an object of the present invention to provide a new and improved signal analyzer apparatus with an automatic frequency measuring function by means of which high-precision frequency measurement can be accomplished both quickly and easily.

According to the present invention, there is provided a signal analyzer apparatus comprising:

input means for receiving an input signal to be measured;

sweep width information generating means for generating sweep width information for performing sweeping/measurement with a predetermined frequency width;

local oscillation signal generating means for receiving the sweep width information from the sweep width information generating means and generating a local oscillation signal having a predetermined frequency;

frequency converting means, connected to the input means and the local oscillation signal generating means, for converting the input signal to be measured into an intermediate-frequency signal corresponding to the local oscillation signal;

resolution bandwidth setting means for setting predetermined resolution bandwidth information associated with extraction of the intermediate-frequency signal;

extracting means, connected to the frequency converting means and the resolution bandwidth setting means, for extracting the intermediate-frequency signal, in accordance with the predetermined resolution bandwidth information;

detecting means for detecting an output from the extracting means;

A/D-converting means for converting a detected analog signal from the detecting means into a corresponding digital signal;

memory means for storing the digital signal from the A/D-converting means in correspondence with a frequency;

display means for displaying the digital signal stored in the memory means, as data developed on a frequency axis;

frequency measuring range setting means for setting predetermined frequency measuring range information corresponding to predetermined data among the data to be displayed on the display means;

determination mean, connected to the sweep width information generating means and the resolution bandwidth setting means, for outputting a determination result, to allow frequency measurement, when the predetermined resolution bandwidth information and the sweep width information satisfy a predetermined relationship;

frequency measuring means, connected to the local oscillation signal generating means, the extracting means, and the determination means, for measuring the signal to be measured, on the basis of frequencies of the local oscillation signal and the output from the extracting means, in response to the determination result;

control means, connected to the determination means, the frequency measuring range setting means, and the sweep width information generating means, for changing an initial sweep width of the sweep width information to a sweep width corresponding to the frequency measuring range information prior to reception of the determination result, and setting the sweep width information to be zero upon reception of the determination result; and output means, connected to the frequency measuring means, for outputting a measurement result of the frequency of the signal to be measured.

According to an aspect of the present invention, in order to solve the above-described problems associaed with the prior art, measurement is performed by detecting the frequency of a peak point by use of previous measuring data, setting the detected frequency as a center frequency, and setting a span to be narrower, by a predetermined width, than a previous measuring span, and a sweep time to correspond to the set span. The operation of gradually narrowing and measuring the span is sequentially repeated until span×α becomes smaller than an RBW. Then, the frequency of a peak point at which the above condition is satisfied is set as a center frequency, and the span is set to be zero, so that tuning to and reception of the input signal to be measured can be performed. Thus, the frequency at this time is measured. According to another aspect of the present invention, before measurement is performed by narrowing the span, initial measuring data and conditions are stored, and then frequency measurement is performed in the same manner as in the first aspect, while the stored data is displayed on a display screen. According to still another aspect of the present invention, a marker or zone setting means is added to the second aspect, so that the frequency of an input signal to be measured at an arbitrary point can be measured, in addition to the frequency at a peak point.

As a common means of the first to third aspects for achieving such objects, a signal analyzer apparatus for selecting and detecting a received signal by a desired RBW using an IF circuit while sweeping a local oscillator in an analog manner, storing the resultant data in a memory, and displaying the data using display means, comprises sweep signal generating means for generating a sweep signal for controlling the local oscillator in an analog manner to allow measurement within a desired measuring frequency range (span), peak search means for outputting a frequency value corresponding to a maximum value of the data in the memory, discriminating means for comparing a span set in the frequency sweeping means with a resolution bandwidth set in the IF circuit when measurement is performed using the desired span, and outputting the comparison result, frequency control means for causing the sweep signal generating means for performing sweeping/measurement on the basis of the comparison result from the discriminating means by setting a frequency detected by the peak search means as a center frequency and using a span narrower than the span in the previous measurement, and frequency measuring means for measuring the frequency of an input signal using output frequencies from the local oscillator and the IF circuit on the basis of the comparison result from the discriminating means when the frequency control means causes the sweep signal generating means to perform measurement by minimizing the span.

BRIEF DESCRIPTION OF THE DRAWINGS

This and other objects and features of the present invention can be understood through the following embodiments, by reference to the accompanying drawings, of which:

FIG. 1 is a block diagram showing an arrangement of a frequency measuring section using a conventional spectrum analyzer;

FIGS. 2A to 2F are views showing data display examples;

FIGS. 3A, 3B, and 3C are block diagrams respectively showing arrangements of first, second, and third embodiments of the present invention;

FIG. 5A is a timing chart for explaining the operation of the first embodiment;

FIGS. 6A, 6B, and 6C are block diagrams respectively showing arrangements of fourth, fifth, and sixth embodiments of the present invention;

FIGS. 7A, 7B, and 7C are flow charts for explaining operations of the fourth, fifth, and sixth embodiments;

DETAILED DESCRIPTION OF THE PREFERRED EMBODIMENTS

Figure 3C:
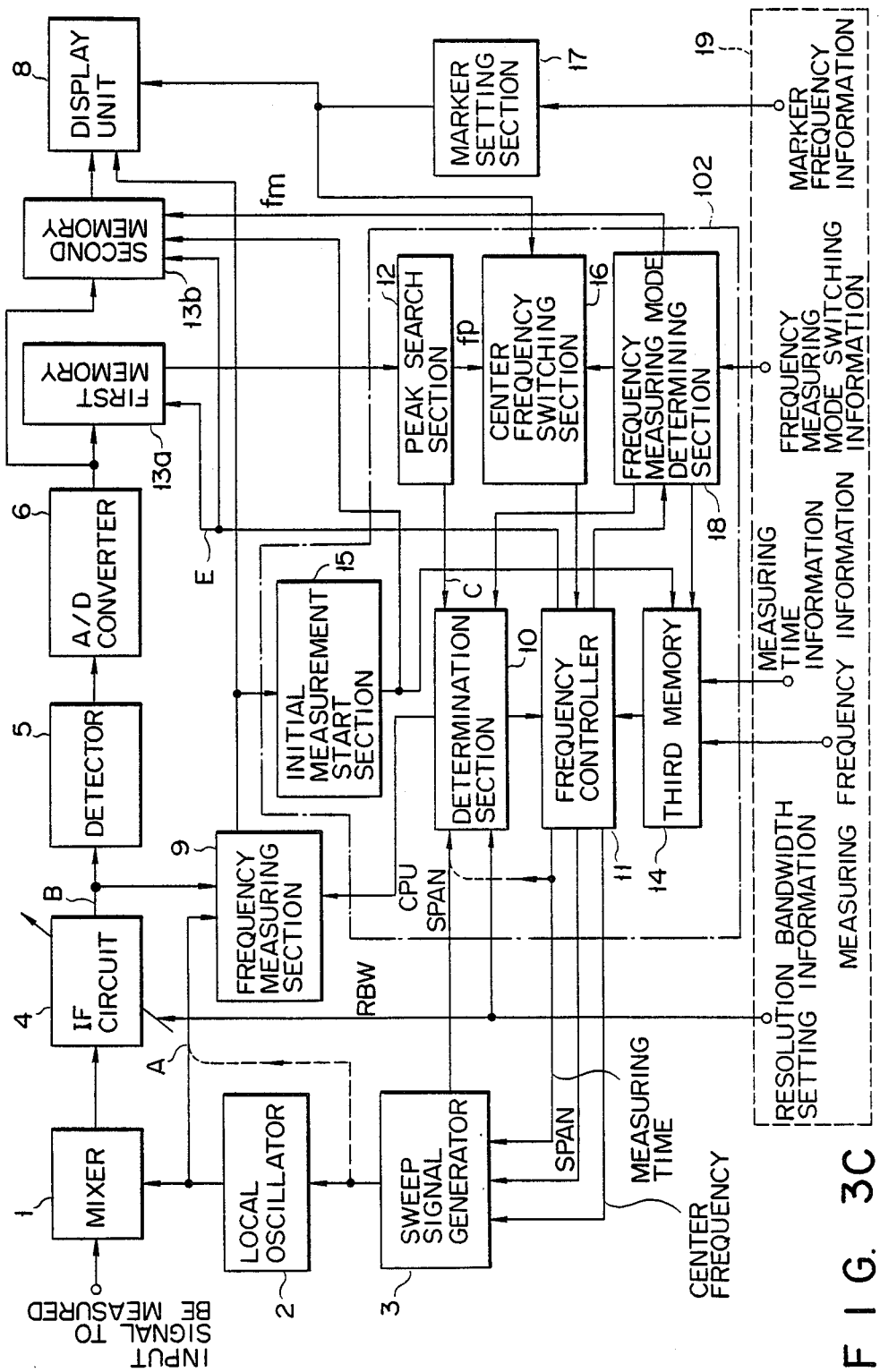
Figure 4A:
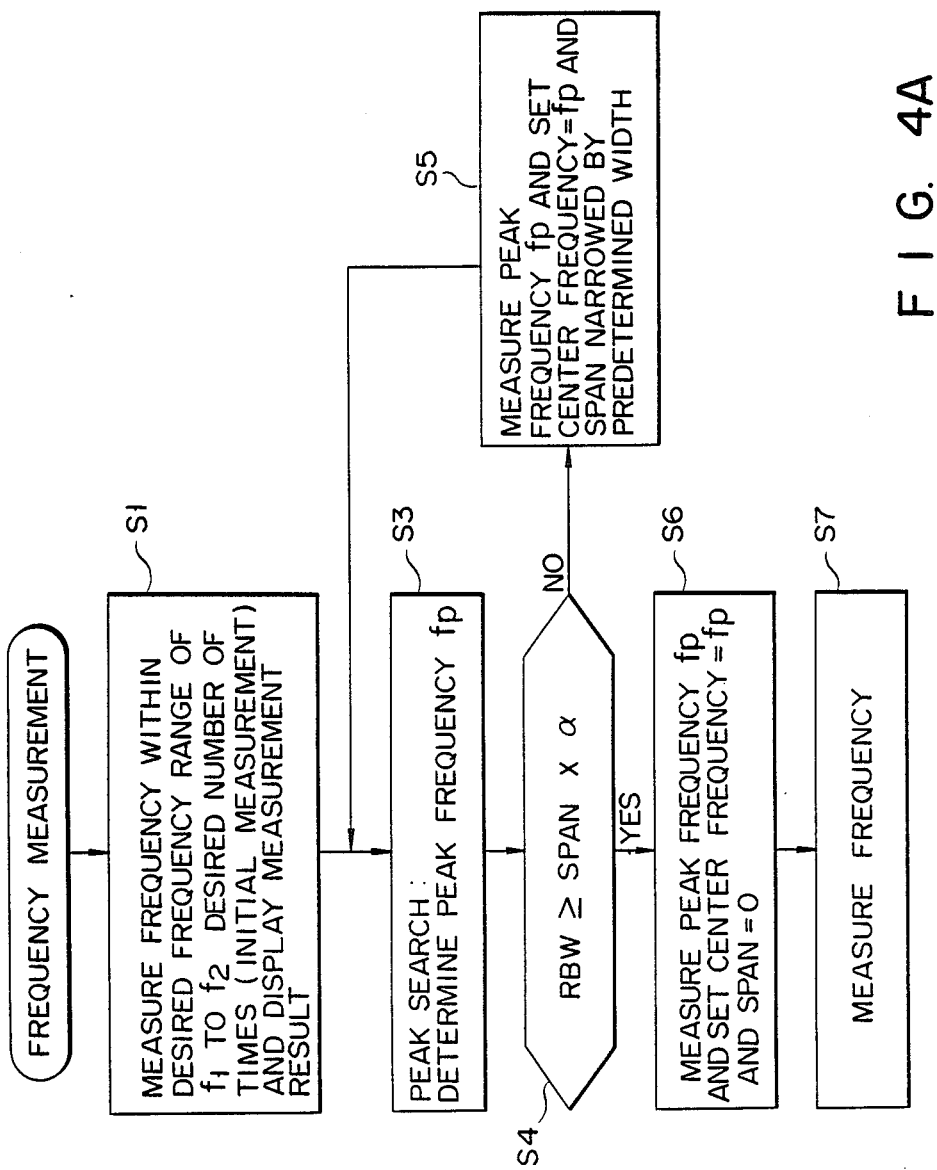
FIGS. 4A, 4B, and 4C are flow charts for explaining operations of the first, second, and third embodiments, respectively.
Figure 4B:
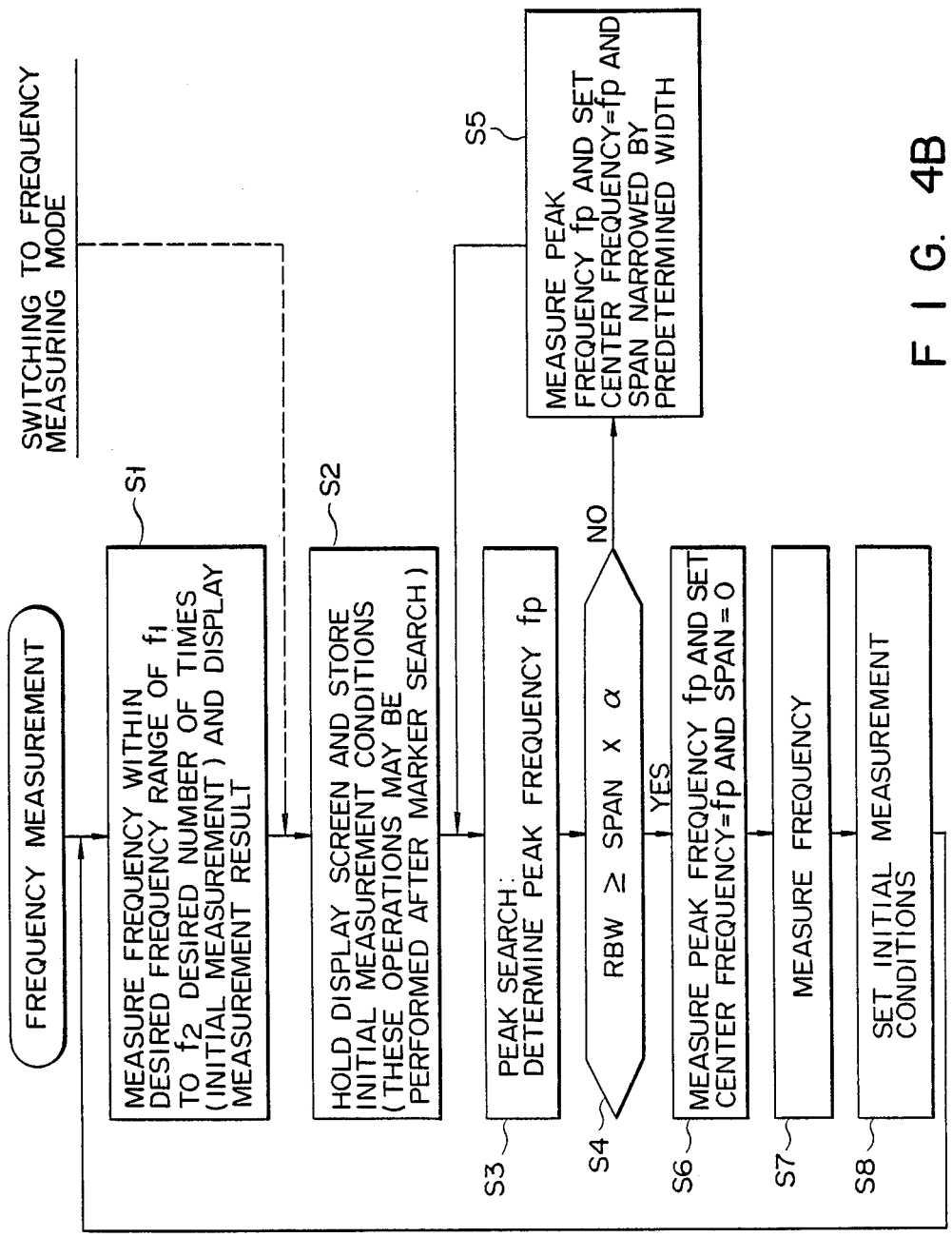
Figure 4C:
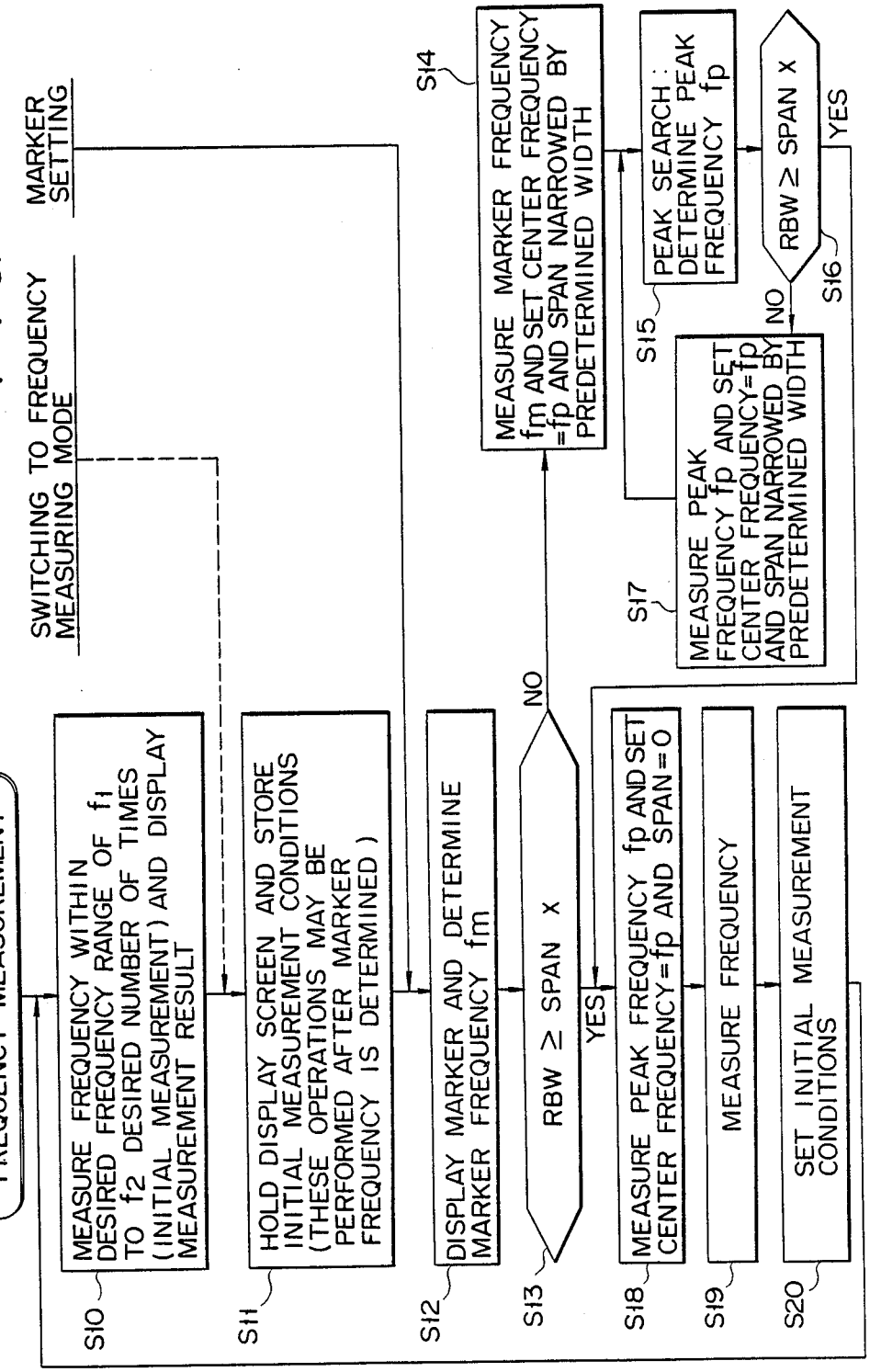
Figure 5B:
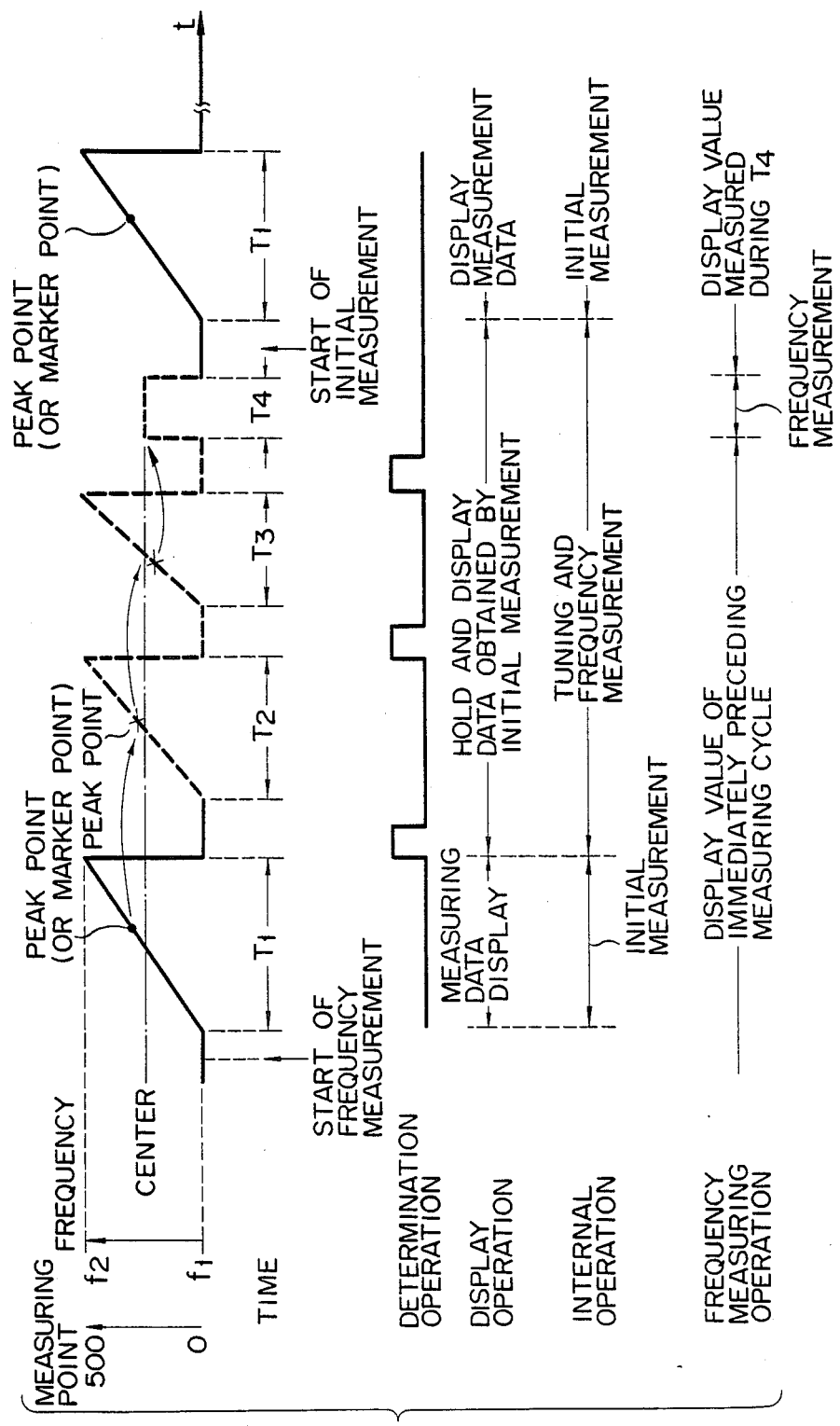
FIG. 5B is a timing chart for explaining the operation of the second and third embodiments.

FIGS. 3A, 3B, and 3C show arrangements of first, second, and third embodiments, respectively. FIGS. 4A, 4B, and 4C are flow charts for explaining operations of the first, second, and third embodiments, respectively. FIG. 5A is a timing chart for explaining the operation of the first embodiment, and FIG. 5B is a timing chart for explaining the operation of the second and third embodiments. As is shown in these drawings, the second embodiment is a simplified form of the third embodiment, and the first embodiment is a simplified form of the second embodiment. For this reason, the third embodiment will be described first.

Referring to FIG. 3C, parts denoted by reference numerals 1, 2, 4 to 6, and 8 are operated in the same manner as in the conventional technique illustrated in FIG. 1. Sweep signal generator 3 controls local oscillator 2 by supplying an output signal corresponding to a designated measuring time, span, and center frequency, in accordance with a command from frequency controller 11, which will be described later. In response to a command from determination section 10 (to be described later), frequency measuring section 9 additively counts output frequencies A and B from local oscillator 2 and IF circuit 4 within the designated time, and supplies to display unit 8 (in this embodiment, detector 5 performs beat-down detection), thereby causing display unit 8 to perform a digital (numerical) display. At the same time, frequency measuring section 9 outputs a count end signal to initial measurement start section 15, which will be described later. First and second memories 13a and 13b respectively store data from A/D converter 6, in correspondence with the frequency of an input signal to be measured, first memory 13a reading and storing data every sweep cycle. When a frequency measuring mode is set as frequency measuring mode switching information to be set by control panel 19 (to be described later), second memory 13b locks (write inhibit) an input signal and stores the data at that time, to cause display unit 8 to display it in response to a command from frequency measuring mode determining section 18. This locked state is released when a command is supplied from initial measuring start section 15 or when the frequency measuring mode switching information is a release command of the frequency measuring mode. Third memory 14 stores initial measuring conditions, in accordance with measuring frequency information and measuring time information set by control panel 19. When the above frequency measuring mode is set, an output from third memory 14 is locked (read inhibit) in response to a command from frequency measuring mode determining section 18. However, this output can be read out from memory 14 in response to either a command from initial measuring start section 15 or the above-described frequency measuring mode release command. In response to the count end signal from frequency measuring section 9, initial measurement start section 15 releases the locked states of second and third memories 13b and 14, as described above, and provides an instruction of performing sweep measurement by the initial conditions set prior to frequency measurement. Center frequency switching section 16 instructs frequency controller 11 to perform measurement by setting a marker frequency from marker setting section 17 to be a center frequency in accordance with marker frequency information set by control panel 19 in a sweep operation, immediately after the frequency measuring mode is set, and to perform measurement by setting the peak frequency at a peak level point detected by peak search section 12, in the succeeding sweep operations.

Determination section 10, which operates in accordance with a command from frequency measuring mode determining section 18, or search completion signal c, compares a resolution bandwidth (RBW), based on resolution band width information supplied from control panel 19 and set in IF circuit 4, with a span set in sweep signal generator 3, and determines whether the comparison result satisfies the following inequality representing a condition allowing accurate frequency measurement:

$$RBW \geq span \times \alpha$$

and outputs a determination result to frequency controller 11. In addition, determination section 10 provides a measurement start instruction to frequency measuring section 9 only when the determination result satisfies the above-described condition. When the determination result from determination section 10 does not satisfy the above condition, frequency controller 11 instructs sweep signal generator 3 to sweep, using the span narrowed by a predetermined width and a reduced measuring time compared with those in the immediately preceding measurement cycle, and by setting the frequency information from center frequency switching section 16 to be a center frequency, thereby performing predetermined measurement. When, on the other hand, the determination result from determination section 10 satisfies the above-described condition, frequency controller 11 causes sweep signal generator 3 to perform measurement by setting the span to be zero, the measuring time to be shorter than that in the immediately preceding measuring cycle, and by using the frequency from center frequency switching section 16 as a center frequency. The span and center frequency information in the above operation are supplied to first and second memories 13a and 13b, as frequency axis information E. Assume that in frequency controller 11, the span and measuring time information for gradually reducing the span and measuring time are stored in, for example, a ROM table.

A series of operations of these blocks are scheduled (programmed) in central processing unit (CPU) 102, which will be described later. In CPU 102, especially, determination section 10, frequency controller 11, peak search section 12, third memory 11, initial measurement start section 15, center frequency switching section 16, frequency measuring mode determining section 18, and the like are realized by combining hardware components including peripheral circuits such as a ROM and a RAM as well as the CPU with predetermined software. Control panel 19 has keys or knobs so that each desired measuring condition can be externally entered as each information described above.

The operation of the first embodiment, based on the flow chart shown in FIG. 4C, will now be described with reference to the block diagram of FIG. 3C, the timing chart of FIG. 5B, and the measurement examples shown in FIGS. 2A to 2F.

(1) A measuring frequency range (f1 to f2) and measuring time T1 are stored, as desired measuring conditions, in third memory 14, in accordance with measuring frequency information and measuring time information set by control panel 19. In response to these measuring conditions from third memory 14, frequency controller 11 supplies sweep signal generator 3 with information $fc=(f1+f2)$ and T1, respectively representing a center frequency and a measuring time corresponding to the measuring conditions, thereby performing desired initial measurement. In this case, resolution bandwidth RBW of IF circuit 4 is directly set in IF circuit 4, on the basis of resolution bandwidth information set by control panel 19. In the measurement example shown in FIG. 2A, the result obtained by performing initial measurement using center frequency fc=50 MHz, span=100 MHz, RBW=50 kHz, and SWT (measuring time)=T1=20 s is displayed on the screen of display unit 8 (step S10 in FIG. 4C).

(2) When a frequency measuring mode is set, as frequency measuring mode switching information, by control panel 19, frequency measuring mode determining section 18 reads out control information from frequency controller 11. Upon switching to the frequency measuring mode by means of control panel 19, the initial sweeping measurement is continued for one cycle, as indicated by T1 in FIG. 5B. Then, frequency measuring mode determining section 18 supplies a mode switching signal, for switching to the frequency measuring mode, to center frequency switching section 16, determination section 10, and third and second memories 14 and 13b, this mode being set at a timing delayed by one sweeping cycle, so that a switching operation to the frequency measuring mode can be at a proper timing regardless of the time status in which the initial measurement mode switching is performed.

(3) In response to the signal for switching to the frequency measuring mode, third memory 14 stores the initial measurement conditions from control panel 19, and inhibits reading of the data. Similarly, second memory 13b holds data output from A/D converter 6 during the initial measurement period and causes display unit 8 to display the data. At this time, writing of new data in memory 13b is inhibited. Center frequency switching section 16 supplies marker frequency fm, set by marker setting section 17, to frequency controller 11, so that marker frequency fm is set to be center frequency fc for the next sweep. Note that the inhibited states of the second and third memories continue (as will be described in detail later) until determination section 10 informs frequency controller 11 and frequency measuring section 9 that the above-described conditions are satisfied, and frequency measuring section 9 informs that frequency measurement is completed (step S11).

(4) Upon receiving, from control panel 19, the marker frequency information of the peak point of a desired spectrum, marker setting section 17 causes display unit 8 to display a marker corresponding to the marker frequency information (refer to FIG. 2A). Simultaneously, marker setting section 17 determines frequency fm at the marker, and supplies the determined marker frequency to center frequency switching section 16. This marker setting may be performed at a timing before or after the frequency measuring mode is set. In the example of FIG. 2A, the marker frequency is set at fm=70 MHz (step S12).

(5) Determination section 10 compares the span of the measuring conditions in the initial measurement period, which is supplied from frequency controller 11 or sweep signal generator 3, with an RBW set in IF circuit 4, and discriminates the condition of RBW≧span×0.05 ($\alpha$=0.05 in this example). Since RBW=50 kHz<5 MHz in the example of FIG. 2A, determination section 10 determines that the condition is not satisfied, and acknowledges this to frequency controller 11 (step S13). In response to this acknowledgement, frequency controller 11 generates a control signal from its internal ROM table. This control signal causes sweep signal generator 3 to perform sweeping by narrowing the span to 10 MHz, reducing the measuring time along the span to T2=2 s, and setting the center frequency to be fc=fm=70 MHz, thereby controlling sweep signal generator 3 (step S14). When it is determined that the condition is satisfied, determination section 10 outputs the determination result to frequency controller 11 so as to cause frequency controller 11 to perform step S18, which will be described later (step S13).

(6) When measurement is performed under the conditions of span=10 MHz, measuring time T2=2 s, and center frequency fm, data analyzed by IF circuit 4 having a predetermined value of RBW is stored in first memory 13a in correspondence with the input frequency (step S14). The contents stored in first memory 13a at this time are the same as those shown in FIG. 2B. Note that this stored data is not displayed on the screen. During the period indicated by the dotted line in FIG. 5B, only the data held in memory 13b is displayed.

(7) Peak search section 12 searches a peak level using the data from first memory 13a, determines frequency fp (=80.78 MHz) corresponding to its peak point, and outputs the frequency to center switching section 16. In addition, peak search section 12 requests determination section 10 to perform determination again (step S15).

(8) Determination section 10 performs determination again on the basis of a setting signal of a span and RBW supplied from frequency controller 11 or sweep signal generator 3. In this case, since RBW=50 kHz<span×0.05=500 kHz, determination section 10 supplies an acknowledgement indicating that the condition is not satisfied to frequency 11 again (step S16).

(9) Upon reception of the acknowledgement indicating that the condition is not satisfied from discriminator 10, frequency controller 11 causes sweep signal generator 3 to perform sweeping/measurement in the same manner as described in item (4), i.e., by reducing the span to 1 MHz, which is narrower than that in the immediately preceding measurement, using measuring time T2=200 ms, and setting fp=70.85 MHz detected by peak search section 12 in the immediately preceding cycle to be center frequency fc (step S17). The contents stored in first memory 13a at this time are the same as those shown in FIGS. 2C and 2D (they are not displayed on the screen). Note that the operations of FIGS. 2C and 2D are performed at substantially the same time, and frequency measurement is performed during T3.

(10) Peak search section 12 and determination section 10 perform the same operations as those in item (7) (step S15) and item (8) (step S16) again. At this time, peak search section 12 detects peak frequency fp=70.75 MHz. Since the measuring condition satisfies the relationship of RBW=50 kHz≧span×0.05=50 kHz, determination section 10 acknowledges this to frequency controller 11 and instructs frequency measuring section 9 to start frequency measurement (steps S15 and S16).

(11) In response to the acknowledgement indicating that the condition is satisfied, frequency controller 11 causes sweep signal generator 3 to perform measurement by setting the span to be zero and peak frequency fp measured in the previous cycle to be center frequency fc (step S18).

(12) Upon reception of the frequency measurement start command from determination section 10, frequency measuring section 9 additively counts output frequencies A and B from local oscillator 2 and IF circuit 4, and outputs measurement frequency information (A+B), thereby causing display unit 8 to perform a numerical display. Although this operation is performed at timing T4 shown in FIG. 5B, the numerical display is performed after initial measurement, which will be described later, is restarted (step S19). The contents stored in first memory 13a are the same as those shown in FIGS. 2E and 2F. Note that the processes shown in FIGS. 2E and 2F are performed at substantially the same time (also not displayed).

(13) Initial measurement start section 15 receives a measurement end signal from frequency measuring section 9, and releases the inhibited states of third and second memories 14 and 13b. With this operation, measurement is performed again using the initial measurement conditions, and display unit 8 is caused to display the resultant data.

The description has been made on the third embodiment shown in FIG. 3C. The second embodiment shown in FIG. 3B differs from the third embodiment in that marker setting section 17, center frequency switching section 16, and frequency measurement mode determining section 18 are omitted. FIG. 4B shows the flow chart of the operation of the second embodiment. The operation of the second embodiment is different from that of the third embodiment in that the operations associated with marker setting are omitted. That is, steps S1, S2, S3, S4, S5, S6, S7, and S8 shown in FIG. 4B respectively correspond to steps S10, S11, S12 (replacing marker frequency fm with peak frequency fp output from peak search section 12), S13, S14, S18, S19, and S20. In addition, the operation in step S12 corresponds to that in step S15. Therefore, in the second embodiment, a desired spectrum set by a marker cannot be obtained, unlike in the third embodiment. In the second embodiment, a frequency is measured only at the peak point of a spectrum during measurement. This operation is performed at the same timing as that in FIG. 5B. In addition, the flow of data in first memory 13a is the same as that in FIGS. 4A to 4F. Note that in these drawings, fm=fp.

As shown in FIG. 3A, the first embodiment differs from the second embodiment in that initial measurement start section 15, and second and third memories 13 and 14 are omitted. In the first embodiment, frequency measurement and magnification/monitoring of spectra can be performed by causing display unit 8 to display all the spectra shown in FIGS. 2A to 2F. FIGS. 4A and 5A respectively are the flow chart and the timing chart of the operation of the first embodiment.

Note that in the above description, when determination section 10 determines that the condition represented by the following inequality is satisfied:

$$RBW \geq span \times a$$

the sweep span of local oscillator 2 is set to be zero, and frequency measuring section 9 measures output frequencies A and B from local oscillator 2 and IF circuit 4 at this time. When the span is zero, the output frequency from local oscillator 2 is constant. Therefore, when the sweep span is set to be zero, a synthesizer arrangement having a PLL (Phase Locked Loop) circuit can be used as local oscillator 2. In this case, frequency measuring section 9 need only be informed of the frequency set values of local oscillator 2, as indicated by the broken lines in FIGS. 3A to 3C. Apparently, in this case, sweep signal generator 3 supplies a digital signal based on a command from frequency controller 11 to local oscillator 2.

The operation of each embodiment has been described on the basis of a spectrum analyzer for directly analyzing signals. However, the present invention can be applied to a network analyzer for analyzing a network using known signals. For example, it can be applied to frequency measurement of a peak point of a single resonance characteristic in a tuning circuit. Furthermore, in the third embodiment, peak search section 12 can be replaced with a search section for searching a desired characteristic value including an inflection point so that a frequency of the desired characteristic value at a point designated by a marker in the initial measurement period can be measured.

A peak frequency corresponding to a peak level during measurement is detected in this manner, while an RBW and a span during measurement are compared with each other, each detected peak frequency is subsequently set to be a center value, and measurement is performed setting narrowed span and reduced measuring time until the condition of RBW≧span×α is satisfied, thereby performing frequency measurement when the above-described condition is satisfied. With this arrangement, frequency measurement can be automatically performed with high precision. Consequently, the measuring time can be greatly reduced compared with that of the manual operation (the first, second, and third embodiments).

When a spectrum monitor state is switched to a frequency measurement state, a corresponding display image is held and the measuring conditions at that time are stored so that the display screen can be returned to the initial spectrum monitor state upon frequency measurement (the second and third embodiments). In addition, the next measuring point can be designated by a marker while monitoring the display screen during frequency measurement. With this arrangement, the measuring speed can be increased especially when various spectra are to be monitored and measured (the third embodiment).

Furthermore, in the third embodiment, since marker points are displayed, they can be checked on the display screen.

Figure 6C:
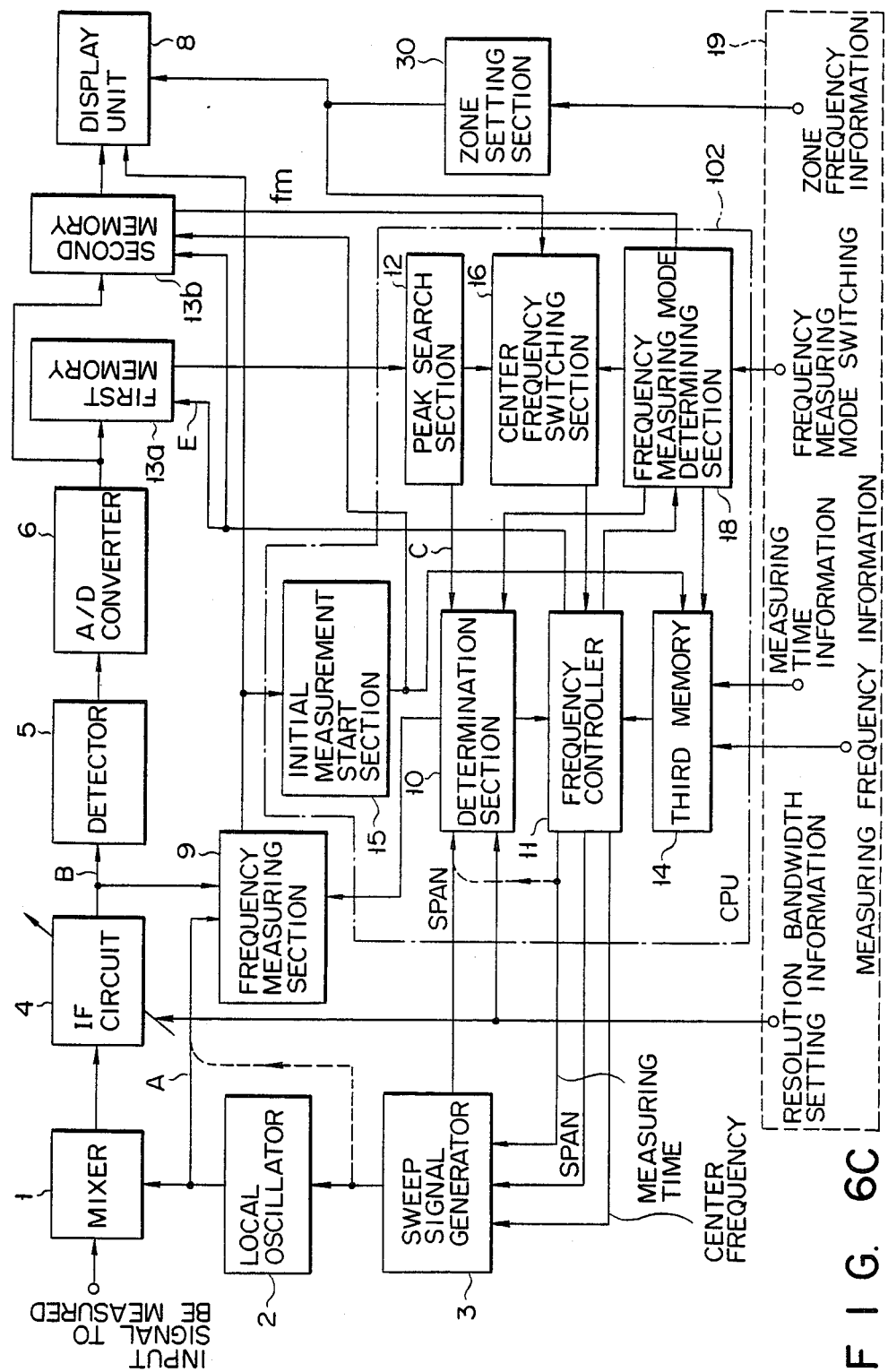
Figure 7A:
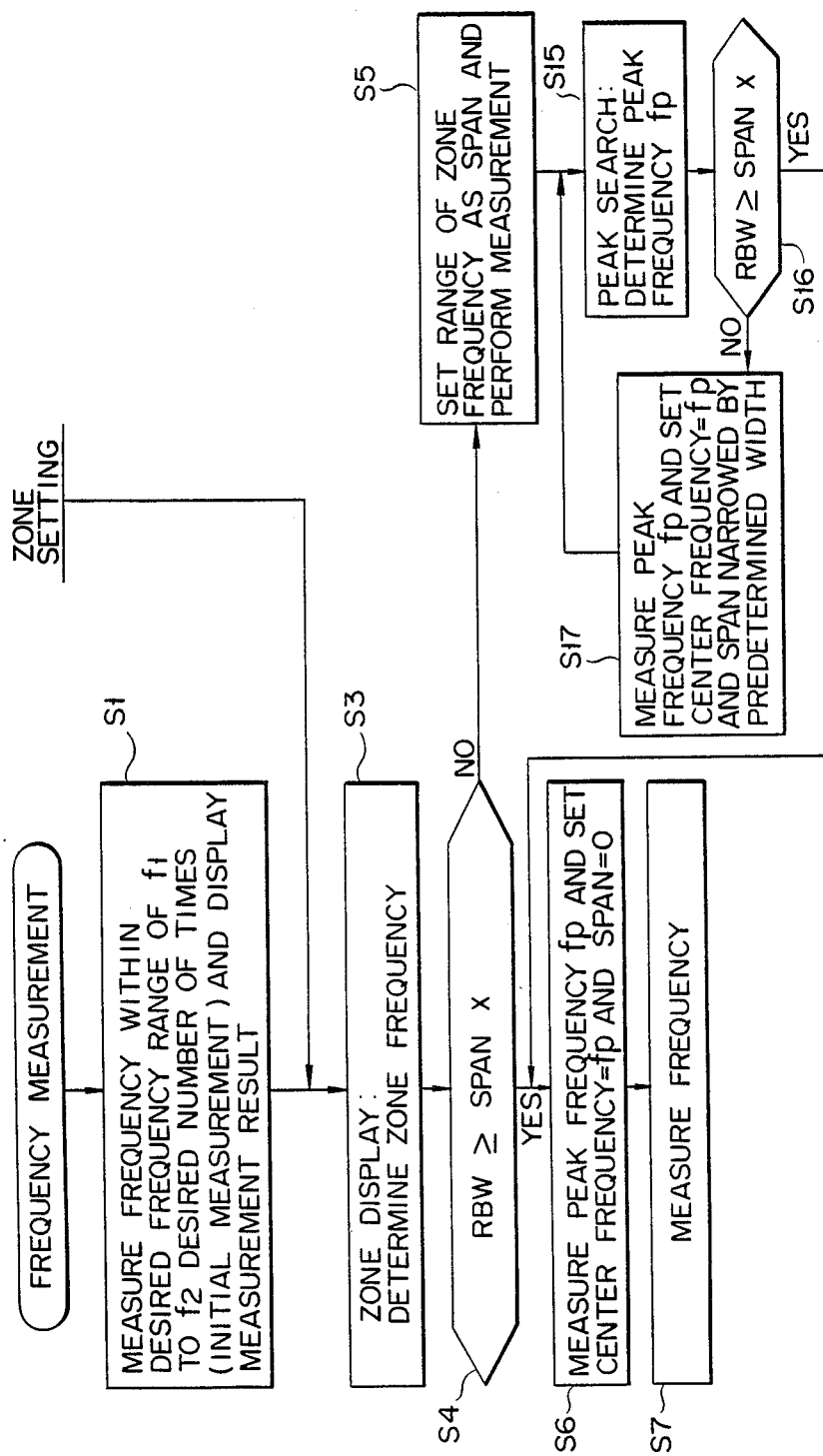
Figure 7B:
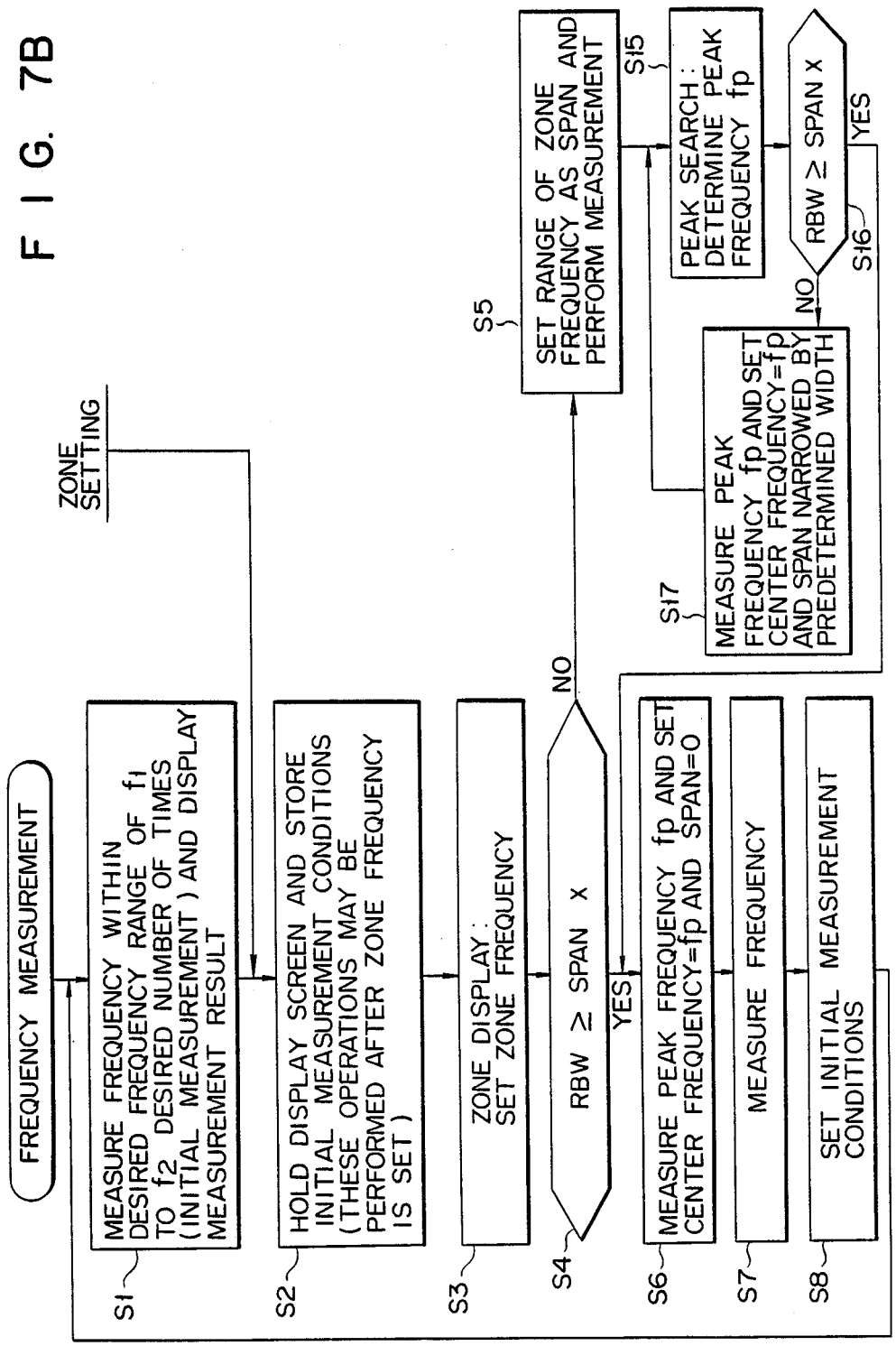
Figure 8A:
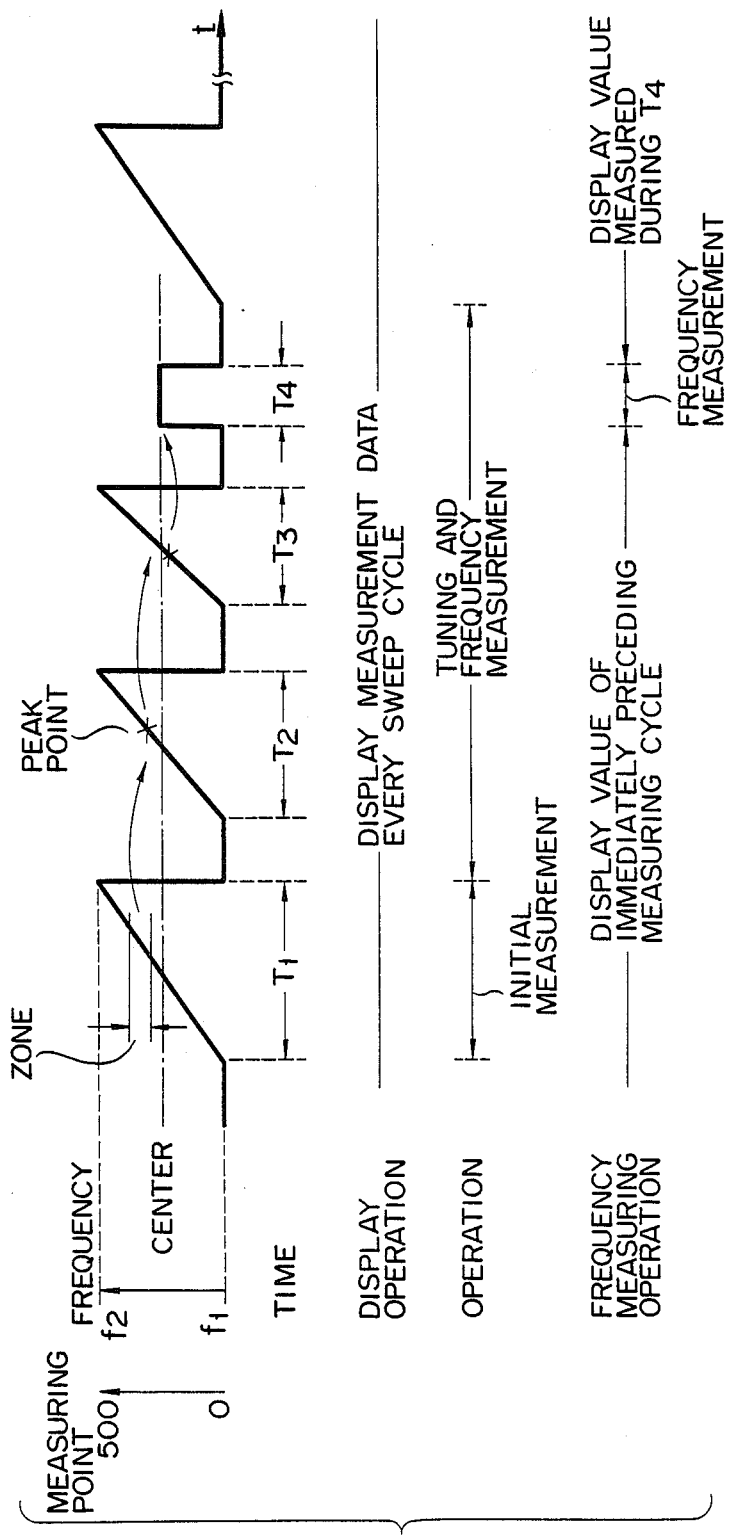
FIG. 8A is a timing chart for explaining the operation of the fourth embodiment.
Figure 8B:
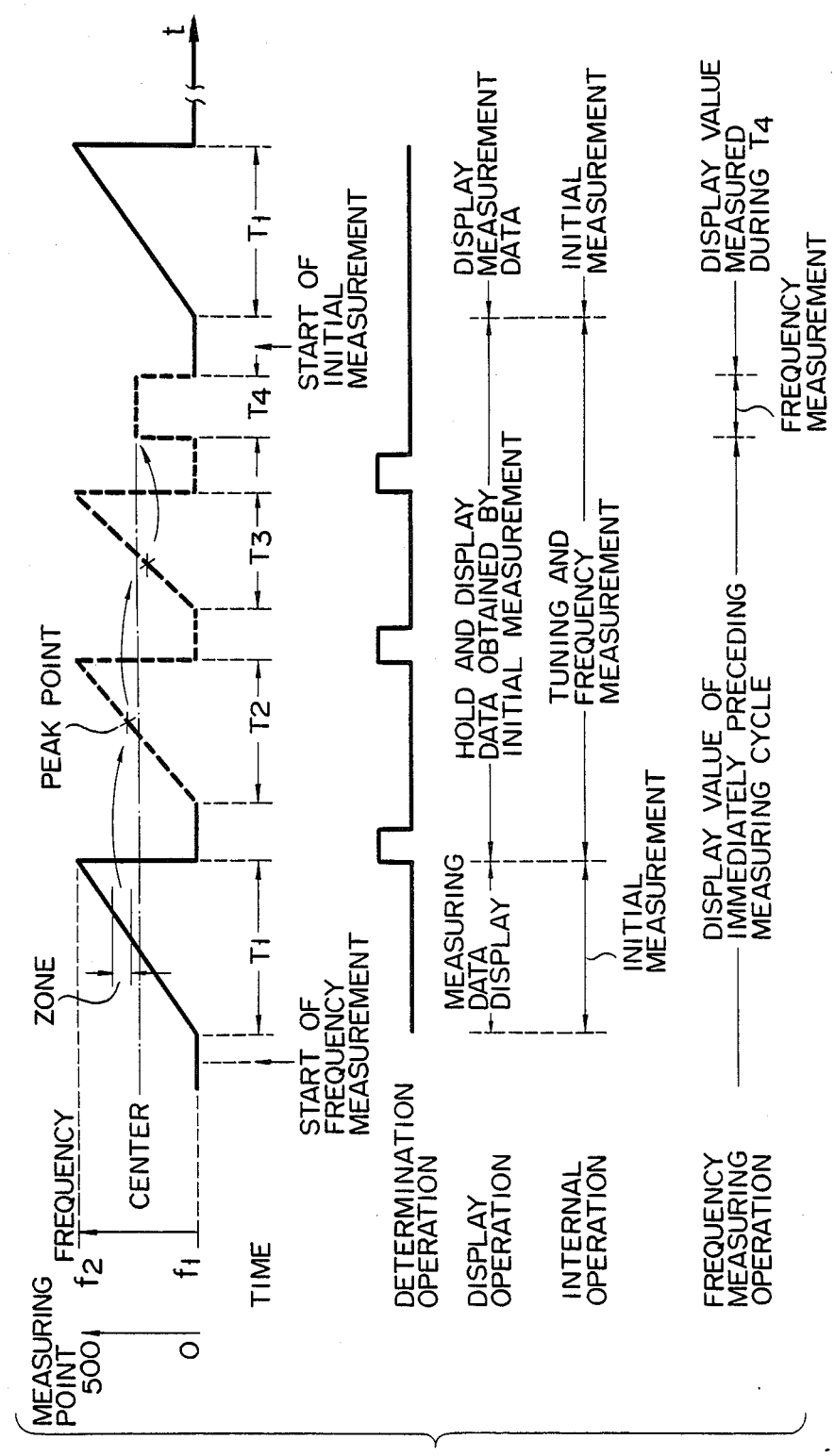
FIG. 8B is a timing chart for explaining the operation of the fifth and sixth embodiments.

FIGS. 6A, 6B, and 6C are block diagrams respectively showing arrangements of fourth, fifth, and sixth embodiments of the present invention. FIGS. 7A, 7B, and 7C are flow charts for respectively explaining operations of the fourth, fifth, and sixth embodiments. FIG. 8A is a timing chart for explaining the operation of the fourth embodiment. FIG. 8B is a timing chart for explaining the operations of the fifth and sixth embodiments. As shown in these drawings, the fifth embodiment is a simplified embodiment of the sixth embodiment, and the fourth embodiment is a simplified embodiment of the fifth embodiment. Thus, the sixth embodiment will be described first.

The sixth embodiment shown in FIG. 6C is equivalent to the third embodiment (FIG. 3C) except that marker setting section 17 and marker frequency information of control panel 19 are respectively replaced with zone setting section 30 and zone frequency information of control panel 19. In this embodiment, zone setting section 30 instructs center frequency switching section 16 to set a zone including a desired spectrum of the spectrum displayed on the screen of display unit 8, as shown in FIG. 2A, to be a measuring frequency range, and causes display unit 8 to display the zone in the form of, e.g., a frame.

A technique associated with zone setting is described in U.S. Pat. No. 4,801,873 (filed on Mar. 2, 1988) entitled "Waveform Measuring Apparatus with Marker Zone Displaying Function", which is issued to the present applicant.

More specifically, as is also apparent from FIGS. 7C and 8B, in the sixth embodiment, instead of performing frequency measurement using a marker frequency as a center frequency as in the above-described third embodiment, frequency measurement is performed using a measuring frequency range set as a desired zone only for one sweep period immediately after a switching operation to the frequency measuring mode is made, and then frequency measurement is performed by the same peak search operation as described above thereafter.

According to the measurement by means of zone setting as in the sixth embodiment, zone setting is performed such that a second peak of adjacent two peaks is set as a measuring target so that the sixth embodiment has an effect of allowing measurement of the frequency at a peak in addition to the effects of the above-described embodiments. In the measurement performed simply by peak search, only the first peak can be measured and the second peak cannot be measured.

The fifth and fourth embodiments respectively correspond to the first and second embodiments except that measurement by means of zone setting using zone setting section 30 and center frequency switching section 16 is added. FIGS. 7B and 8B are a flow chart and a timing chart of the fifth embodiment, respectively. FIGS. 7A and 8A are a flow chart and a timing chart of the fourth embodiment, respectively.

What is claimed is:
1. A signal analyzer apparatus comprising:
input means for receiving an input signal to be measured;
sweep width information generating means for generating sweep width information for performing sweeping/measurement with a predetermined frequency width;
local oscillation signal generating means for receiving the sweep width information from said sweep width information generating means and generating a local oscillation signal having a predetermined frequency;
frequency converting means, connected to said input means and said local oscillation signal generating means, for converting the input signal to be measured into an intermediate-frequency signal corresponding to the local oscillation signal;
resolution bandwidth setting means for setting predetermined resolution bandwidth information associated with extraction of the intermediate-frequency signal;
extracting means, connected to said frequency converting means and said resolution bandwidth setting means, for extracting the intermediate-frequency signal in accordance with the predetermined resolution bandwidth information;
detecting means for detecting an output from said extracting means;
A/D-converting means for converting a detected analog signal from said detecting means into a corresponding digital signal;
memory means for storing the digital signal from said A/D-converting means, in correspondence with a frequency;
display means for displaying the digital signal stored in said memory means, as data developed on a frequency axis;
frequency measuring range setting means for setting predetermined frequency measuring range information corresponding to predetermined data of the data to be displayed on said display means;
determination means, connected to said sweep width information generating means and said resolution bandwidth setting means, for outputting a determination result for allowing frequency measurement when the predetermined resolution bandwidth information and the sweep width information satisfy a predetermined relationship;
frequency measuring means, connected to said local oscillation signal generating means, said extracting means, and said determination means, for measuring the signal to be measured on the basis of frequencies of the local oscillation signal and the output from said extracting means, in response to the determination result;
control means, connected to said determination means, said frequency measuring range setting means, and said sweep width information generating means, for changing an initial sweep width of the sweep width information to a sweep width corresponding to the frequency measuring range information prior to reception of the determination result, and setting the sweep width information to be zero upon reception of the determination result; and output means, connected to said frequency measuring means, for outputting a measurement result of the frequency of the signal to be measured.

2. An apparatus according to claim 1, wherein said frequency measuring range setting means includes peak search means, connected to said memory means, for detecting a peak value of the data to be displayed on said display means, and said control means includes means for receiving a peak value detection output from said peak search means, and changing the sweep width information to a predetermined sweep width, narrower than the initial sweep width, in accordance with the peak value detection output.

3. An apparatus according to claim 2, wherein said determination means includes means for outputting a second determination result, requesting a change of the sweep width information, when the resolution bandwidth information and the predetermined sweep width do not satisfy the predetermined relationship, and said control means includes means for receiving the second determination result, and changing the sweep width information to a second predetermined sweep width, narrower than the predetermined sweep width.

4. An apparatus according to claim 1, wherein said frequency measuring range setting means includes zone setting means for zone setting, as the frequency measuring range information, a portion including desired data of the data to be displayed on said display means, and said control means includes means for receiving a zone setting value from said zone setting means and changing the sweep width information in accordance with the zone setting value.

5. An apparatus according to claim 4, wherein said frequency measuring range setting means includes peak search means, connected to said memory means, for detecting a peak value within a zone set on said display means, and said control means includes means for receiving a peak value detection output from said peak search means and changing the sweep width information to a predetermined sweep width, narrower than a width corresponding to the zone setting value.

6. An apparatus according to claim 5, wherein said determination means includes means for outputting a second determination result, requesting a change of the sweep width information, when the resolution bandwidth information and the sweep width information corresponding to the zone setting value or the predetermined sweep width do not satisfy the predetermined relationship, and said control means includes means for receiving the second determination result and changing the sweep width information to sweep width information corresponding to the zone setting value, or to a second or third predetermined sweep width, narrower than the predetermined sweep width.

7. An apparatus according to claim 1, wherein said frequency measuring range setting means includes marker setting means for setting a marker on data, among the data to be displayed on said display means, having a desired characteristic, and said control means includes means for receiving a marker setting value from said marker setting means and changing the sweep width information in accordance with the marker setting value.

8. An apparatus according to claim 7, wherein said frequency measuring range setting means includes peak search means, connected to said memory means, for detecting a peak value within a sweep width set by the sweep width information corresponding to a marker set on said display means, and said control means includes means for receiving a peak value detection output from said peak search means and changing the sweep width information to a predetermined width narrower than the sweep width information corresponding to the marker setting value.

9. An apparatus according to claim 8, wherein said determination means includes means for outputting a second determination result, requesting a change of the sweep width information, when the resolution bandwidth information and the sweep width information corresponding to the marker setting value or the predetermined sweep width do not satisfy the predetermined relationship, and said control means includes means for receiving the second determination result and changing the sweep width information to sweep width information corresponding to the marker setting value, or to a second or third predetermined sweep width, narrower than the predetermined sweep width.

10. An apparatus according to claim 7, wherein said memory means includes first and second memories respectively connected to said peak search means and said display means.

11. An apparatus according to claim 7, wherein said control means includes memory means for storing an initial measuring condition.

12. An apparatus according to claim 11, wherein the initial measuring condition is externally set.

13. An apparatus according to claim 7, further comprising initial measurement start means for receiving a measurement end acknowledgement from said frequency measuring means and instructing said control means to start measurement using the initial sweep width.

14. An apparatus according to claim 1, wherein a measurement result of the frequency from said output means is numerically displayed on said display means.

15. A signal analyzer apparatus comprising:

a local oscillator whose frequency is controlled;

sweep signal generating means for generating a signal for causing said local oscillator to perform sweeping/measurement within a range of desired measuring frequency;

a mixer for receiving an output from said local oscillator and converting an input signal to be measured into an intermediate-frequency signal;

an IF circuit for selectively outputting the intermediate-frequency signal with a desired resolution bandwidth;

a detector for detecting a signal from said IF circuit;

an A/D converter for converting an output from said detector into a digital signal;

a memory for storing the digital signal in accordance with the desired measuring frequency;

display means for reading out data from said memory and displaying the readout data in accordance with the desired measuring frequency;

peak search means for outputting a frequency value corresponding to a maximum value of the data in said memory;

determination means for comparing the measuring frequency range set in said sweep signal generating means with the resolution bandwidth set in said IF circuit, and outputting a comparison result;

sweep frequency control means for causing said sweep signal generating means, on the basis of the comparison result, to perform sweeping by setting a frequency detected by said peak search means as a center frequency and using a measuring frequency sweep width, narrower than the desired measuring frequency range used in the previous measurement cycle, and to perform measurement using the narrower sweep width; and frequency measuring means for measuring a frequency of the input signal to be measured, using output frequencies from said IF circuit and said local oscillator, on the basis of the comparison result from said determination means, and outputting a measurement result.

16. A signal analyzer apparatus comprising:

a local oscillator whose frequency is controlled;

sweep signal generating means for generating a signal for causing said local oscillator to perform sweeping/measurement within a desired measuring frequency range;

a mixer for receiving an output from said local oscillator and converting an input signal to be measured into an intermediate-frequency signal;

an IF circuit for selectively outputting the intermediate-frequency signal with a desired resolution bandwidth;

a detector for detecting a signal from said IF circuit;

an A/D converter for converting an output from said detector into a digital signal;

a data memory for storing the digital signal in accordance with the measuring frequency;

display means for reading out data from said data memory and displaying the readout data in accordance with the measuring frequency;

a measuring condition memory for storing an initial condition when measurement is performed using the desired measuring frequency range;

peak search means for outputting a frequency value corresponding to a maximum value of the data in said data memory;

means for instructing said measuring condition memory to lock an output thereof to inhibit reading out of the initial measuring condition, and to store the data;

determination means for comparing the measuring frequency range set in said sweep signal generating means with the resolution bandwidth set in said IF circuit, and outputting a comparison result;

sweep frequency control means for causing said sweep signal generating means, on the basis of the comparison result, to perform sweeping by setting a frequency detected by said peak search means as a center frequency and using a measuring frequency sweep width, narrower than the desired measuring frequency range used in the previous measurement cycle, and to perform measurement using the narrower sweep width;

frequency measuring means for measuring a frequency of the input signal to be measured, using output frequencies from said IF circuit and said local oscillator, on the basis of the comparison result from said determination means, and outputting a measurement result; and initial measurement start means for receiving a frequency measurement end signal from said frequency measuring means and releasing said data and measuring condition memories from their locked states.

17. A signal analyzer apparatus comprising:

a local oscillator whose frequency is controlled;

sweep signal generating means for generating a signal for causing said local oscillator to perform sweeping/measurement within a desired measuring frequency range;

a mixer for receiving an output from said local oscillator and converting an input signal to be measured into an intermediate-frequency signal;

an IF circuit for selectively outputting the intermediate-frequency signal with a desired resolution bandwidth;

a detector for detecting a signal from said IF circuit;

an A/D converter for converting an output from said detector into a digital signal;

a data memory for storing the digital signal in accordance with the measuring frequency;

display means for reading out data from said data memory and displaying the readout data in accordance with the measuring frequency;

zone setting means for setting a zone in a desired range of an image displayed on said display means, determining a zone frequency, and outputting a determination result;

search means for outputting a frequency value of a desired characteristic value of the data in said data memory corresponding to the zone;

a measuring condition memory for storing an initial condition when measurement is performed using the desired measuring frequency range;

frequency measuring mode determining means for providing an instruction for measuring a frequency of the desired characteristic value set by said zone setting means, causing said measuring condition memory to lock an output so as to inhibit reading out of the initial measuring condition, and causing said data memory to lock an input and hold the data;

determination means for comparing measuring frequency range information output from said sweep signal generating means with the resolution bandwidth set in said IF circuit, upon reception of the instruction from said frequency measuring mode determining means, and outputting a comparison result;

sweep frequency control means for causing said sweep signal generating means, on the basis of the comparison result, to perform sweeping by setting a frequency output from said search means as a center frequency and using a measuring frequency sweep width, narrower than the desired measuring frequency range used in the previous measurement cycle, and to perform measurement using the narrower sweep width;

frequency measuring means for measuring a frequency of the input signal to be measured, using output frequencies from said IF circuit and said local oscillator, on the basis of the comparison result from said determination means, and outputting a measurement result;

center frequency switching means for switching the output frequencies from said search means and said zone setting means, and outputting a switched frequency to said control means; and initial measurement start means for receiving an output signal from said frequency measuring means and releasing said data and measuring condition memories from their locked states.

* * * * *